United States Patent
McCullough

(10) Patent No.: US 6,237,223 B1
(45) Date of Patent: May 29, 2001

(54) METHOD OF FORMING A PHASE CHANGE HEAT SINK

(75) Inventor: Kevin A. McCullough, Warwick, RI (US)

(73) Assignee: Chip Coolers, Inc., Warwick, RI (US)

( * ) Notice: Subject to any disclaimer, the term of this patent is extended or adjusted under 35 U.S.C. 154(b) by 0 days.

(21) Appl. No.: 09/568,748

(22) Filed: May 11, 2000

Related U.S. Application Data

(63) Continuation of application No. 09/306,120, filed on May 6, 1999, now abandoned.

(51) Int. Cl.[7] .................................................. B23P 15/26
(52) U.S. Cl. .................................. 29/890.032; 29/890.03
(58) Field of Search ........................ 29/890.032, 890.03; 165/104.26, 104.33

(56) References Cited

U.S. PATENT DOCUMENTS

| | | | |
|---|---|---|---|
| 4,099,556 | 7/1978 | Roberts, Jr. ............................ | 165/96 |
| 4,523,636 | 6/1985 | Meijer et al. .................... | 165/104.26 |
| 4,912,548 | 3/1990 | Shanker et al. ......................... | 357/82 |
| 4,971,142 | * 11/1990 | Mergler ............................ | 165/104.14 |
| 5,046,553 | 9/1991 | Lindner ............................ | 165/104.26 |
| 5,213,153 | 5/1993 | Itoh ................................. | 165/104.33 |
| 5,216,580 | 6/1993 | Davidson et al. .................... | 361/385 |
| 5,253,702 | 10/1993 | Davidson et al. .................... | 165/80.4 |
| 5,314,010 | * 5/1994 | Sakaya et al. .................... | 165/104.26 |
| 5,598,632 | * 2/1997 | Camarda et al. ................. | 29/890.032 |
| 5,660,758 | * 8/1997 | McCullough ......................... | 425/577 |
| 5,667,870 | * 9/1997 | McCullough ......................... | 428/131 |
| 5,720,338 | 2/1998 | Larson et al. ........................ | 165/46 |
| 5,769,154 | 6/1998 | Adkins et al. .................... | 165/104.26 |
| 5,847,925 | 12/1998 | Progl et al. ........................... | 361/687 |
| 5,848,637 | 12/1998 | Lee .................................. | 165/104.21 |
| 5,884,693 | 3/1999 | Austin et al. .................... | 165/104.33 |
| 6,014,315 | * 1/2000 | McCullough et al. ............... | 361/704 |
| 6,093,961 | * 7/2000 | McCullough ......................... | 257/718 |
| 6,139,783 | * 10/2000 | McCullough ........................ | 264/40.1 |

FOREIGN PATENT DOCUMENTS

| | | | |
|---|---|---|---|
| 4-225791 | 8/1992 | (JP) ................................ | 165/104.33 |
| 1326-867 | 10/1985 | (SU) . | |

OTHER PUBLICATIONS

"Therm–A–Pipe", Jan. 5, 1999, http://www.indek.com/heat-pipe/heatpipe.html, 3 pages.

"Ylat–Type Heat Pipes" by P. M. Connors and Q. K. Kerjilian, IBM Technical Disclosure Bulletin, vol. 18 No. 3 Aug. 1975, pp. 675 and 676.

* cited by examiner

*Primary Examiner*—Irene Cuda Rosenbaum
(74) *Attorney, Agent, or Firm*—Barlow, Josephs & Holmes, Ltd.

(57) ABSTRACT

A method of forming a phase change passive heat sink, with a base member and heat dissipating members, is provided. The base member is hollow and defines an evaporation chamber therein. A number of heat dissipating members are connected to the base member. Each of the heat dissipating members are substantially tubular in configuration with a closed end and an open end and defining respective condensation chambers therein. The open ends of the heat dissipating members are connected to the base member with the condensation chambers and are in fluid communication with the evaporation chamber. A heat transporting media resides in the base member which is movable into the condensation chambers upon application of heat to the base member. Heat is dissipated through the heat dissipating members.

10 Claims, 5 Drawing Sheets

METHOD OF FORMING A PHASE CHANGE HEAT SINK

This application is a continuation of U.S. Ser. No. 09/306,120, filed May 6, 1999 now abandoned.

BACKGROUND OF THE INVENTION

The present invention relates generally to the cooling of heat generating surfaces and objects. More specifically, the present invention relates to apparatuses for dissipating heat generated by such objects. In addition, the present invention relates to cooling of heat generating objects passively by use of a phase-change media without the use of external fans or devices to assist in cooling.

In industry, there are various parts and components that generate heat during operation. For example, in the electronics and computer industries, it is well known that computer components generate heat during operation. Various types of electronic device packages and integrated circuit chips, such as the PENTIUM central processing unit chip (CPU) manufactured by Intel Corporation and RAM (random access memory) chips are such devices that generate heat. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

There are a number of prior art methods to cool heat generating components and objects to avoid device failure and overheating, as discussed above- A block heat sink or heat spreader is commonly placed into communication with the heat generating surface of the object to dissipate the heat therefrom. Such a heat sink typically includes a base member with a number of individual cooling members, such as fins, posts or pins, to assist in the dissipation of heat. The geometry of the cooling members is designed to improve the surface area of the heat sink with the ambient air for optimal heat dissipation. The use of such fins, posts of pins in an optimal geometrical configuration greatly enhances heat dissipation compared to devices with no such additional cooling members, such as a flat heat spreader.

To further enhance air flow and resultant heat dissipation, fans and devices have been used, either internally or externally. However, these external devices consume power and have numerous moving parts. As a result, heat sink assemblies with active devices are subject to failure and are much less reliable than a device which is solely passive in nature.

It has been discovered that more efficient cooling of electronics can be obtained through the use of passive heat pipes which require no external power source and contain no moving parts. Generally, the heat pipe is in the form a vacuum-tight vessel in a particular geometric shape which is evacuated and partially filled with a working fluid. The heat pipe passively transfers heat from a heat source to a heat sink where heat is dissipated. As the heat is conducted into the heat pipe, the fluid is vaporized in an evaporator section creating a pressure gradient in the heat pipe. This forces the vapor to flow along the heat pipe to the condenser section, where the vaporized fluid is condensed and turned back to its fluid state by giving up its latent heat of vaporization. The working fluid is then returned to the evaporator section to repeat the process of removing the heat generated by the heat source. One method used to achieve cooling by use of a heat pipe places the evaporator section at the lower end and the condenser section at the upper end where the heat pipe is in a substantially vertical position. Once the working fluid has been condensed, the liquid flows by gravity back to the evaporator section. Internal wick structures may be used to assist liquid flow back to the evaporator section by capillary action to reduce the effect of gravity on the device.

In view of the foregoing, there is a demand for a heat sink assembly that is capable of dissipating heat. There is a demand for a passive heat sink assembly with no moving parts that can provide heat dissipation without the use of active components. In addition, there is a demand for a complete heat sink assembly that can provide greatly enhanced heat dissipation over prior art passive devices.

SUMMARY OF THE INVENTION

The present invention preserves the advantages of prior art heat dissipation, heat exchanger devices and heat pipes. In addition, it provides new advantages not found in currently available devices and overcomes many disadvantages of such currently available devices.

The invention is generally directed to the novel and unique phase change heat sink assembly with particular application in cooling heat generating components and objects. The heat sink assembly of the present invention enables the simple, easy and inexpensive assembly, use and maintenance of a heat dissipation device which is extremely reliable with, essentially, no maintenance during the life of the device. The assembly of the present invention has particular application in providing heat dissipation for electronic components which are particularly sensitive to overheating.

The phase change heat sink of the present invention includes a base member and a number of individual heat dissipating members. The base member is hollow and defines an evaporation chamber therein. A number of heat dissipating members are connected to the base member. Each of the heat dissipating members are substantially tubular in configuration with a closed end and an open end and defining respective condensation chambers therein. The open ends of the heat dissipating members are connected to the base member with the condensation chambers and are in fluid communication with the evaporation chamber. A heat transporting media resides in the base member which is movable into the condensation chambers upon application of heat to the base member. Heat is dissipated through the heat dissipating members. Further, the present invention preferably includes a wick structure within the base and individual heat dissipating members. The wick structure in the heat dissipating members assists, by capillary action, in returning condensate back to the base evaporator region. The present invention simultaneously provides both the advantages of a phase change heat pipe and the improved geometry of a heat sink to provide a greatly enhanced heat dissipating device.

It is therefore an object of the present invention to provide a method of forming a heat dissipating device that can provide enhanced heat dissipation for a heat generating component or object.

It is an object of the present invention to provide a method of forming a heat dissipating device that can provide enhanced heat dissipation passively without the use of active components.

It is a further object of the present invention to provide a method of forming a heat dissipating device that has no moving parts.

Another object of the present invention is to provide a method of forming a heat dissipating device that does not consume power.

It is a further object of the present invention to provide a method of forming a heat dissipating device that has the advantages of both a phase change heat pipe and the improved cooling member geometry of a heat sink.

Another object of present invention is to provide a method of forming a heat dissipation device that is a combination heat pipe and heat sink configuration that is substantially insensitive to gravity.

A further object of the present invention is to provide a method of forming a heat dissipation device that is inexpensive to manufacture.

Another object of the present invention is to provide a method of forming a heat dissipation device that has a thermal conductivity greater that conventional heat pipe and heat sink designs.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
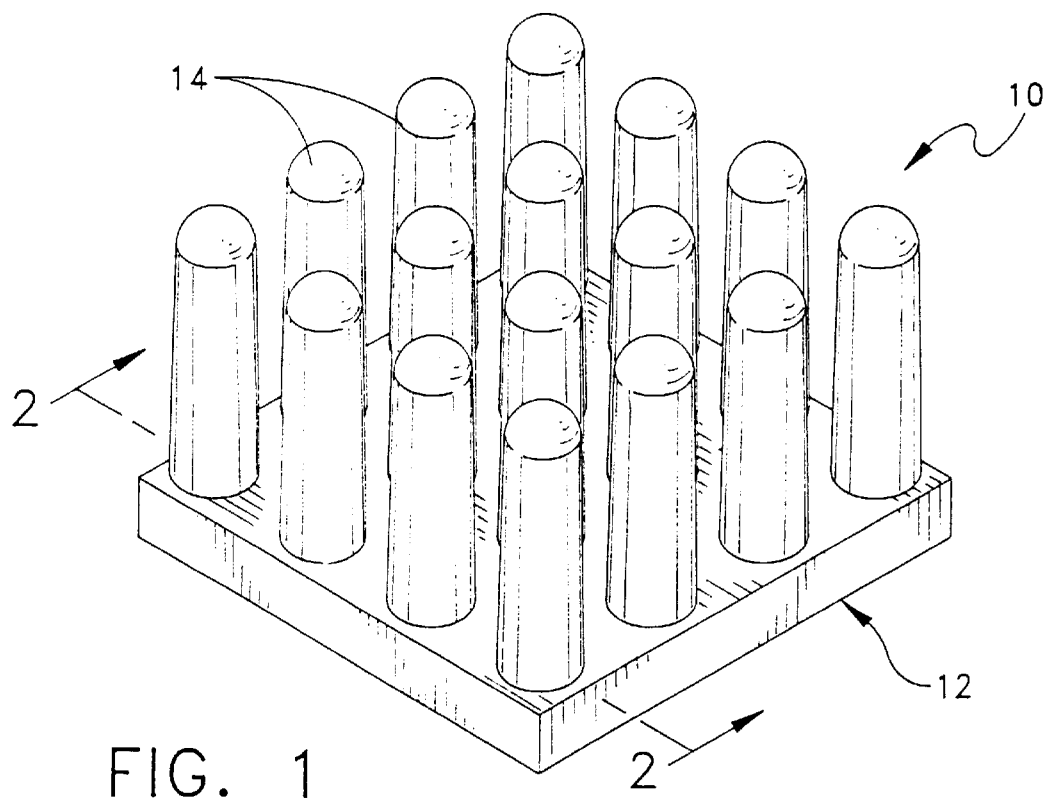
FIG. 1 is a perspective view of the preferred embodiment of the heat pipe in accordance with the present invention.

Turning first to FIG. 1, a perspective view of the preferred embodiment of the heat dissipation device 10 of the present invention is shown. In particular the heat dissipation device 10 includes a base 12 with a number of cooling members 14 emanating upwardly therefrom. FIG. 1, for illustration purposes, shows a preferred embodiment where a 4 by 4 pin grid or array of posts are provided as the cooling members 14 on the base 12. It should be understood that other configurations of the cooling members 14 may be used to suit the application at hand. For example, a larger or smaller array may be used. Also, the configuration of each cooling member 14 may be modified and still be within the scope of the present invention. Each cooling member 14 is shown to be substantially tubular in shape with a substantially circular cross-section; however, the cooling members 14 may be flattened plate-like members with non-circular cross-sections, and the like.

Figure 2:
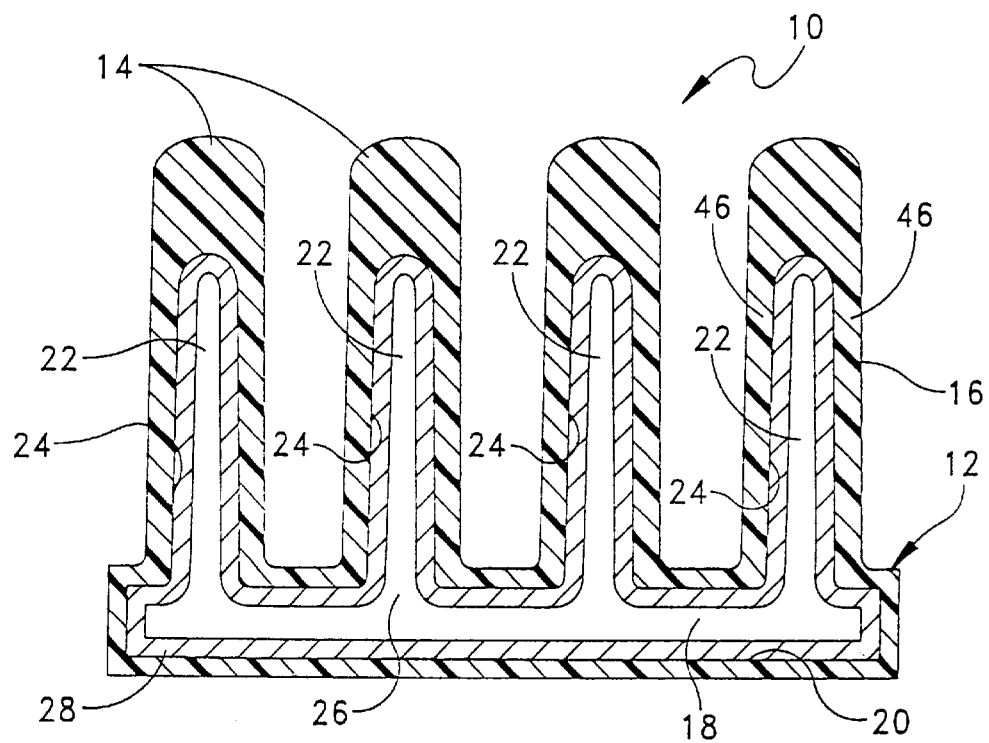
FIG. 2 is a cross-sectional view through the line 2—2 of FIG. 1.

Referring now to FIGS. 1 and 2, the general configuration of the heat dissipating device 10 of the present invention is shown. The device of the present invention includes an outer housing with a substantially hollow base 12, defining a base chamber 18 therein with an inner base chamber wall 20, as well as a number of individual cooling members 14, which are shown as upstanding posts. For illustration purposes, the invention will be discussed in detail in accordance with the post or pin grid array; however, other configurations are contemplated as discussed above. The individual cooling member posts 14 are substantially tubular in configuration in that the individual configurations define respective post chambers 22 therein, each having respective inner post walls 24. As can best be seen in FIG. 2, a cross-sectional view through the line 2—2 of FIG. 1, the post chambers 22 are connected to or flow directly into the base chamber 18 to form a continuous interior device chamber, generally referred to as 26.

Figure 7:
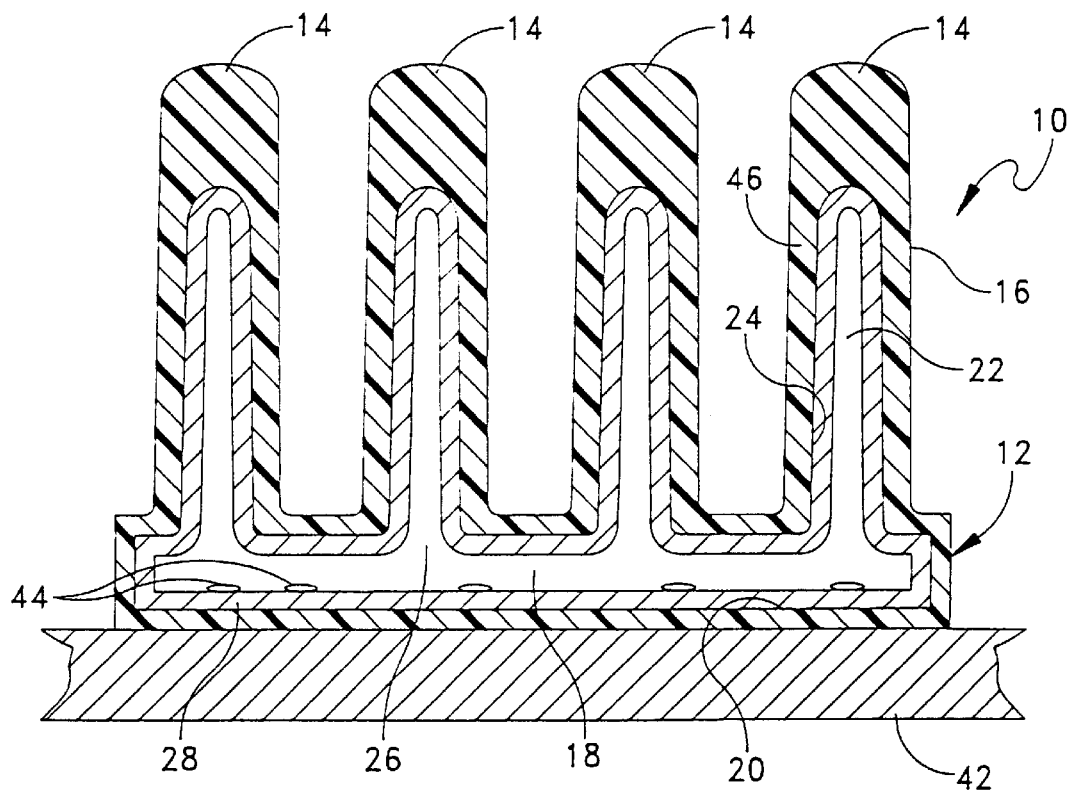
FIG. 7 is a cross-sectional view of the preferred embodiment of the present invention in contact with a heat generating surface.
Figure 8:
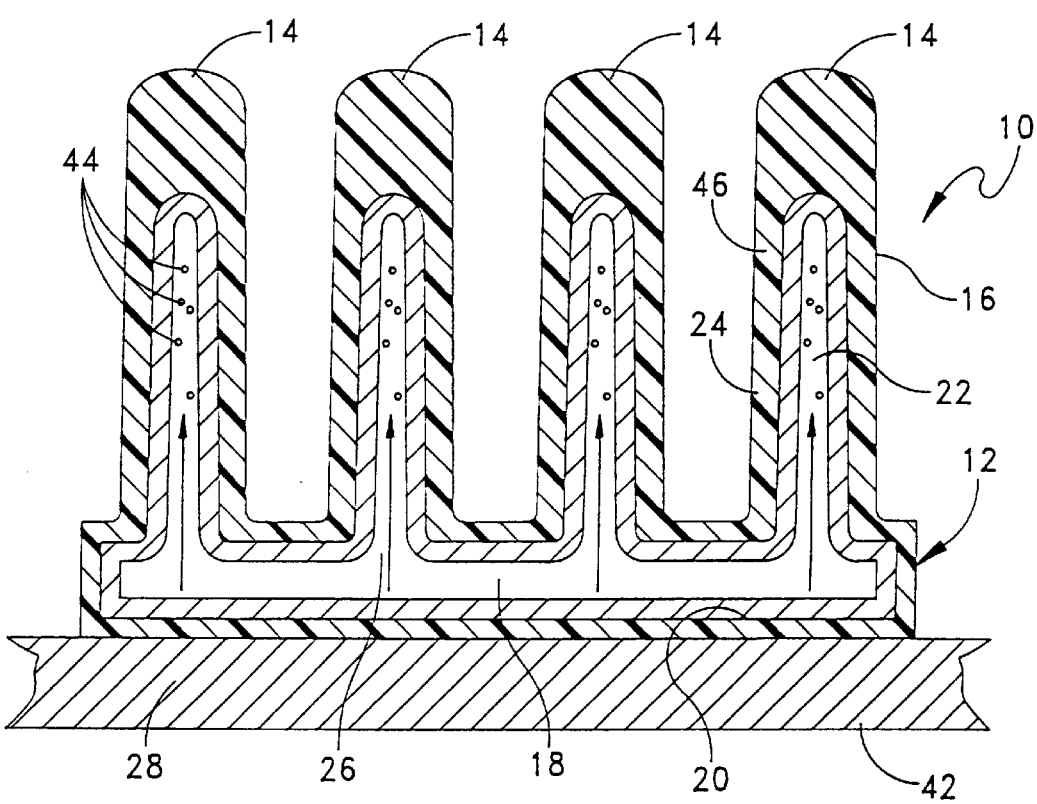
FIG. 8 is a cross-sectional view as shown in FIG. 7 illustrating evaporation of heat transporting media into the discrete cooling members and resultant heat dissipation.
Figure 9:
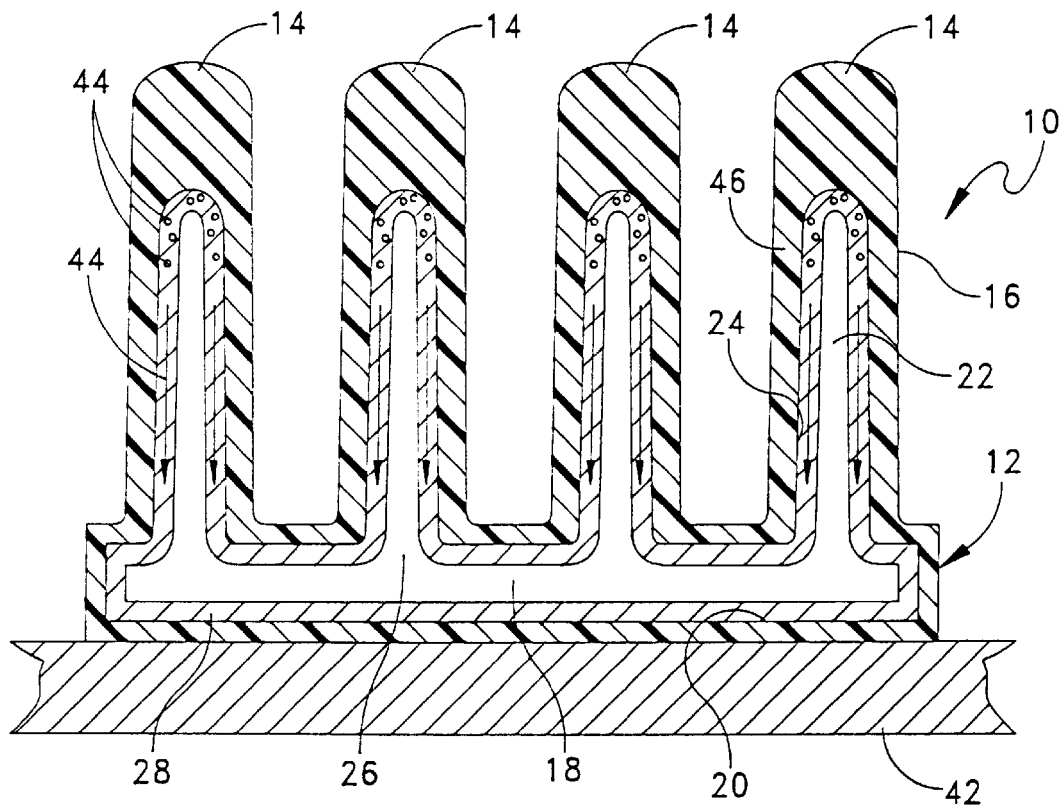
FIG. 9 is a cross-sectional view as shown in FIG. 7 illustrating the travel of condensed heat transporting media to the base portion of the heat pipe in accordance with the present invention.

Still referring to FIG. 2, the preferred embodiment of the present invention also includes a wick layer 28 within the outer housing 16 for assisting the movement of heat transporting media, as will be shown in FIGS. 7–9, within the device chamber 26. This wick layer 28 is preferably provided over the entire inner surface of the device 10, particularly over the inner post wall surfaces 24 and the inner base wall surface 20.

Figure 3:
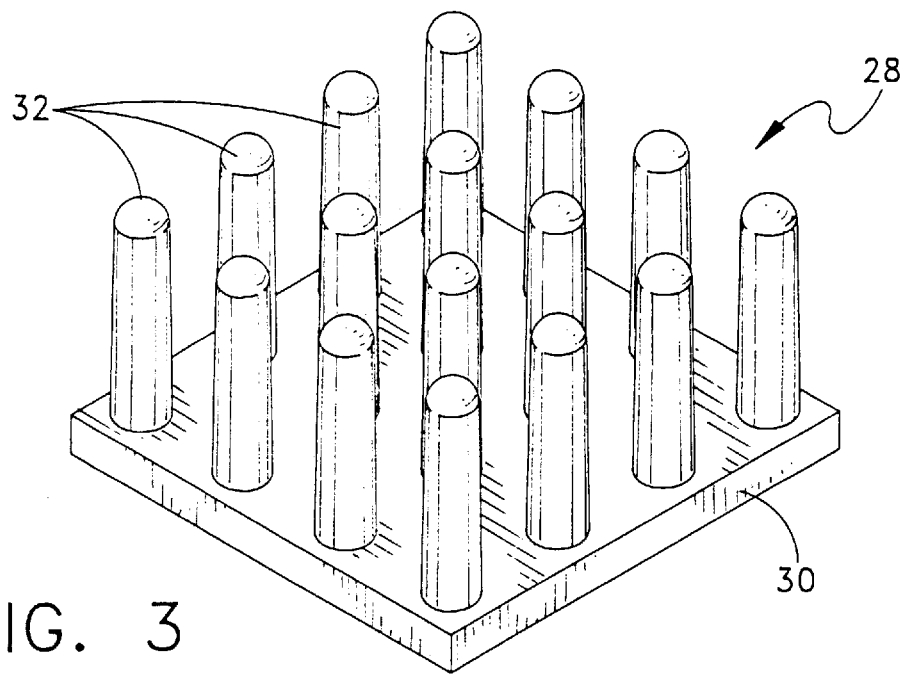
FIG. 3 is a perspective view of the wick structure in accordance with the preferred embodiment of the present invention shown in FIG. 1.
Figure 4:
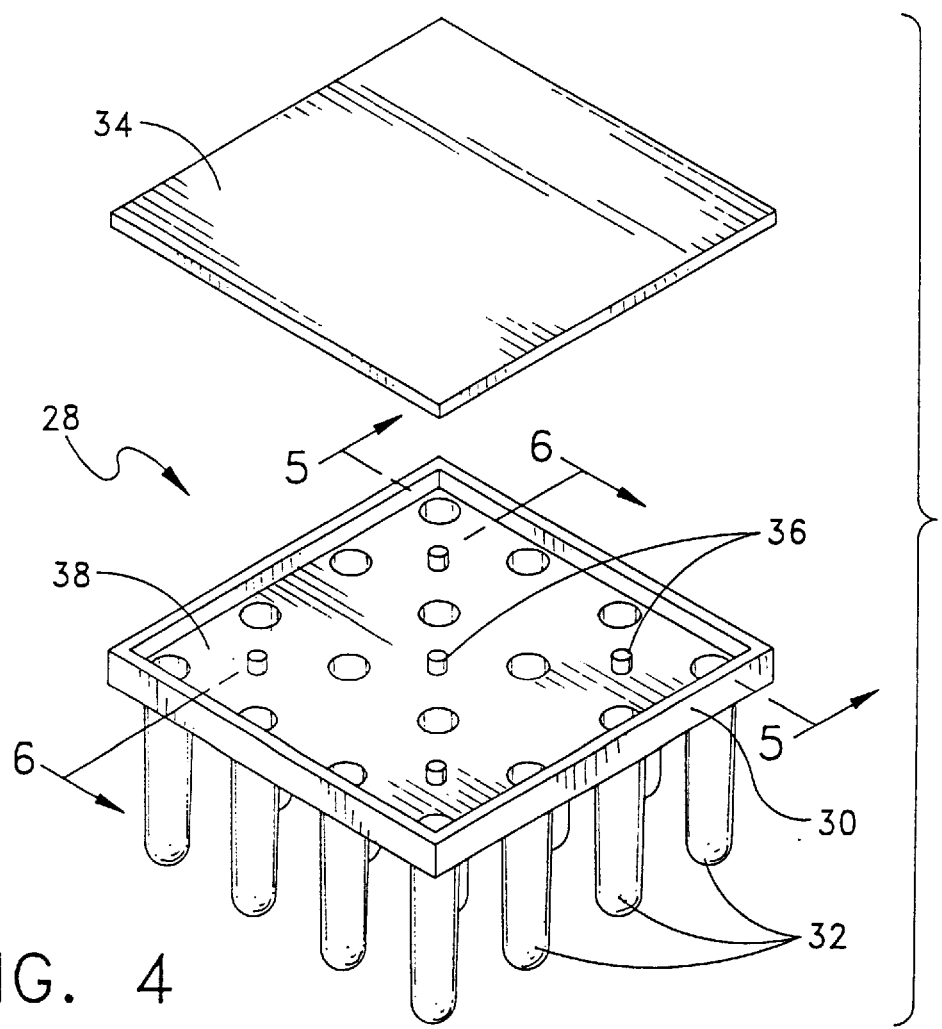
FIG. 4 is a an inverted perspective view of the wick structure shown in FIG. 3 with its lowermost plate portion removed for illustration purposes.
Figure 5:
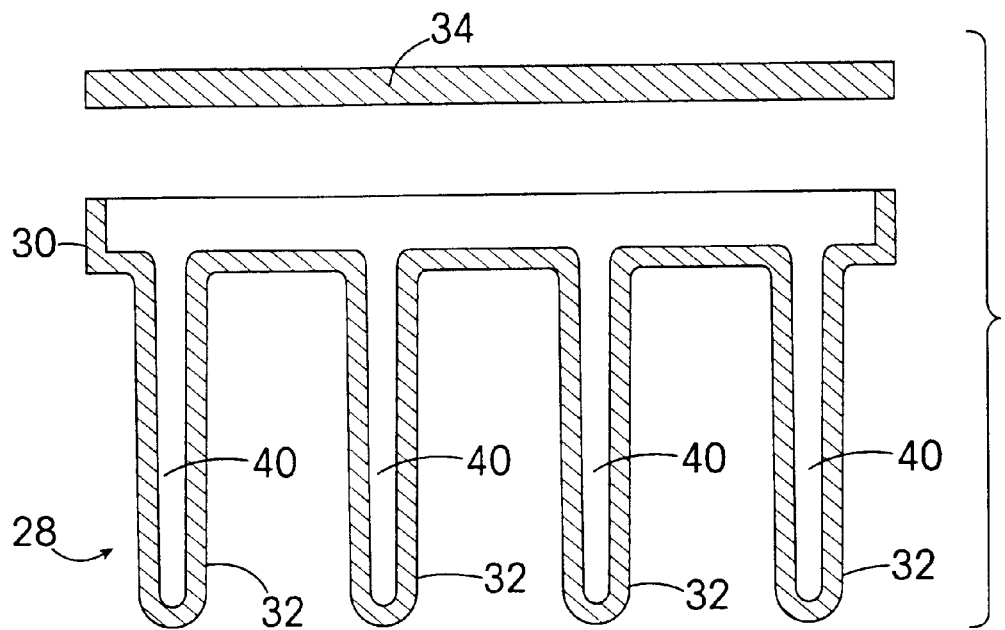
FIG. 5 is a cross-sectional view through the line 5—5 of FIG. 4.
Figure 6:
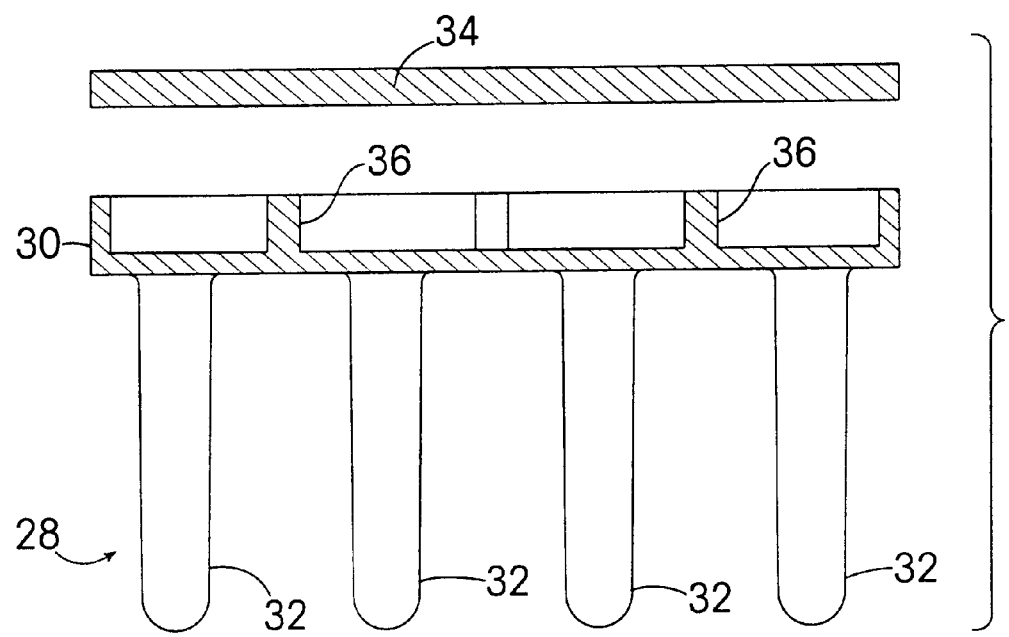
FIG. 6 is a cross-sectional view through the line 6—6 of FIG. 4.

Turning now to FIGS. 3–6, details of the wick structure 28 of the present invention is shown. FIG. 3 illustrates a perspective view of the preferred wick structure 28 while FIG. 4 illustrates an inverted perspective view. To further show the details of the wick structure 28, FIG. 5 shows a cross-sectional view through the line 5—5 of FIG. 4 and FIG. 6 shows a cross-sectional view through the line 6—6 of FIG. 4. Referring to FIGS. 3–6, the wick structure 28 includes a base portion 30 with post-like protrusions 32 which correspond to cooling members 14 of the outer housing 16. For illustration purposes, lowermost wick plate portion 34 is removed. With this plate 34 removed, the internal structure can be seen in detail. In actual production of the wick structure 28, this plate member 34 may or may not be separable from the rest of the wick structure 28. To further preserve the structural integrity of the wick structure 28, reinforcement bumps 36 are optionally provided on the wick floor 38 in spaced apart relation to one another. This prevents the lowermost plate portion 34 of the wick structure 28 from collapsing during molding, installation or use.

Preferably, the post-like protrusions 32 are dimensioned to be slightly smaller than the space defined by inner wall surfaces 24 of the cooling members 14 of the outer housing 16 so as to provide a close tolerance fit during the molding of the outer housing 16. Of course, if the wick structure 28 is created and formed directly on the outer housing 16, the concern for tolerances will not be present. Each of the wick protrusions 32 are, themselves, tubular in configuration each with a central vapor channel therein 40, as shown in FIG. 5. The employment of these channels 40 for vapor flow will be discussed in detail in connection with FIGS. 7–9 below. Also, it is preferred that the number protrusions 32 of the wick structure 28 match the number of cooling members 14 of the outer housing 16 for optimal heat transfer. In general, the wick structure 28 is sized and configured smaller than the outer housing 16 so as to fit completely within the inner chamber 26 to effectively provide a layer adjacent to the inner surfaces 20 and 24 of the outer housing 16. Still further, the wick structure 28 may be modified (not shown) to reside only within the cooling members 14 of the outer housing 16 as opposed to being over entire inner surfaces 20 and 24 of the chamber 26 of the outer housing.

The preferred material for the outer housing 16 is a thermally conductive polymer material to permit flexibility in molding and selection of product geometry. The conductive polymer may include conductive filler therein to achieve high thermal conductivity while still being easily moldable. Further, the outer housing may be pure metal, such as aluminum or copper and like, and may be cast or extruded as desired.

The wick layer 28 is preferably made of any material that capable of providing capillary transport of a liquid. Wick material may be a cloth construction but is preferably a permeable metal, such as hot-pressed or sintered metal powder. The preferred metal is copper although other metals may be employed. Oxygen-free metals are preferred to avoid contamination of the heat transporting media.

The phase change heat sink 10 of the present invention may be manufactured in a number of different ways. Preferably, the wick structure 28 is first prepared, such as by hot-pressing, into the desired configuration and then placed into a mold for subsequent overmolding of the outer housing 16 therearound. A load hole, not shown, is left remaining through the outer housing 16 and wick structure 28 for the introduction of the heat transporting media into the chamber 26 as well as for the creation a suitable vacuum therein. Methods for loading liquid in and creating a vacuum within a chamber are known in the art and need not be discussed herein.

Alternatively, the outer housing 16 may be first created and then a pre-made wick structure 28 may be dropped into the outer housing 16 for later sealing, and the like. Further, the outer housing 16 may be first made and then the wick structure 28 later formed and created directly on the inner walls 20 and 24 of the outer housing 16. The heat dissipating device 10 would then be closed and sealed. The foregoing methods are examples of the different processes for creating the present invention.

Turning now to FIGS. 7–9, the use of the preferred embodiment 10 of the present invention to cool an actual heat generating object 42 is shown. The phase change heat sink assembly 10 is mounted to a heat generating object 42 with the base 12 of the assembly 10 in direct contact with the heat generating object 42. As described above, the heat generating object 42 may be a semiconductor device, or the like. For simplicity, the assembly 10 of the present invention is mounted, via adhesive, clamps, etc., (not shown) directly to the heat generating object 42. Optionally, an interface material (not shown) may be provided between the bottom surface of the base 12 and the top surface of the heat generating object 42 to improve thermal conductivity between the assembly 10 and the heat generating object 42. These attachment methods are known in the art and need not be discussed here.

As stated above, a heat transporting media 44 is sealed within the inner chamber 26 of the assembly 10 of the present invention. The heat transporting media 44 is preferably a few drops of water, but may be ammonia as well. A vacuum is also created. In FIG. 7, the heat generating object 42 is positioned horizontally and the base 12 of the assembly 10 is positioned thereon. As a result, the heat transporting media 44, initially, rests on the floor of the base portion 12 of the assembly 10.

Turning now to FIG. 8, the effects of the heating of the heat generating object 42 is shown. Upon heat-up of the heat generating object 42, the base portion 12 of the assembly 10 of the present invention acts an evaporator. The volume of heat transporting media 44, volume of the interior chamber 26 of the assembly 10 as well as the vacuum present within the assembly 10 may be tuned so that the anticipated temperature of the heat generating object 42 at its operational temperature causes the appropriate evaporation of the heat transporting media 44. FIG. 8 specifically shows the evaporation of the heat generating media 44 into vapor, known as phase change, and subsequent gaseous flow up into the individual respective chambers 22 of the heat cooling members 14. During the upflow into the chambers 22 of the heat cooling members 14, heat is dissipating outward through the sidewalls 46 of the outer housing 16 of the cooling members 14. This heat dissipation is assisted by the geometry of the upstanding cooling members 14 which, heretofore, have not been available in a heat pipe construction, particularly where the cooling members 14, themselves, have chambers 22 which are interconnected with the chamber 18 in the base 12 of the assembly 10 to form a inner chamber generally referred to as 26 with a complex geometry.

In FIG. 9, the condensing and return of heat transporting media 44 to the chamber 18 evaporator base 12 is shown. When gaseous heat transporting media 44 reaches the cooling members 14, after dissipation of heat through the sidewalls 46 thereof, the heat transporting media 44, in vapor form, changes phase back to liquid. The cooling members 14 act as condensers, because they are at a lower temperature than the evaporator base region 12, to change the vapor 44 back to liquid. As indicated by the downward arrows in FIG. 9, the now liquid heat transporting media 44 falls back down to the evaporator chamber 18 of base 12 to re-start the heat transporting and dissipating process. When the base member 12 is horizontally oriented and the cooling members 14 are vertically oriented, gravity assists in re-locating the liquified heat transporting media 44 back to the base evaporator chamber 18.

In addition, the wick structure 28 is provided to further improve the re-location of the heat transporting media 44 back to the evaporator chamber 18 of the assembly 10 and make the overall assembly 10 less sensitive to gravity. When the vapor 44 is condensed, it seeps into the neighboring wick structure 28 which, by capillary action, draws the liquid to the evaporator chamber 18 of base 12 which is hotter than the cooing members 14. Since the cooling members 14 emanate into the air and have a large contact surface area with surrounding air, they are much cooler than the base 12 which is in direct contact with the heat generating object 42. The wick structure 28 is particular useful when the cooling members 14 are oriented in non-vertical direction and positioned above the base member 12 of the assembly 10. For example, when the cooling members 14 are positioned horizontally, such as the position when cooling a processor on a vertically mounted motherboard in a tower case, the wick structure 28 assists in drawing the heat transporting media 44 horizontally back to the evaporation chamber 18 of base member 12. With the assistance of the wick structure 28, it is even possible to operate the assembly 10 in a completely inverted orientation with the base member 12 above with the cooling members 14 downwardly depending therefrom. As a result, the preferred embodiment of the present invention 10 is not particularly sensitive to gravity which allows for a wide range of applications.

Figure 10:
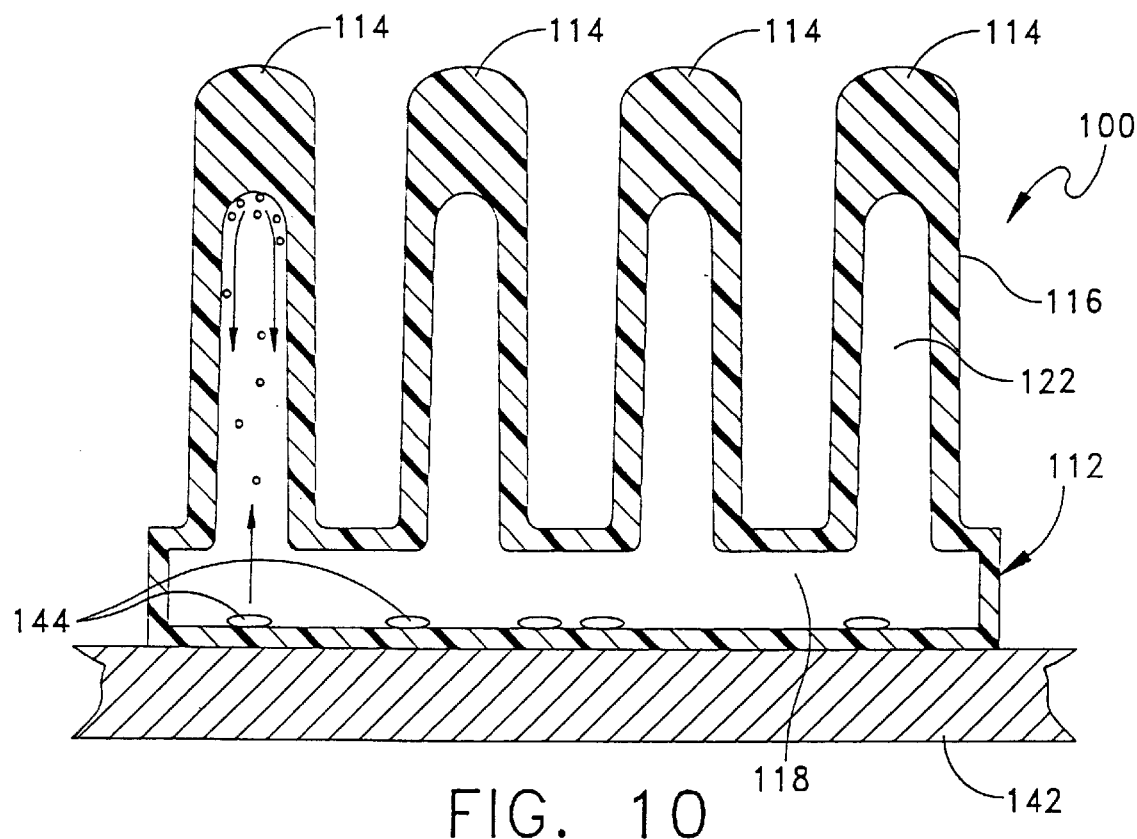
FIG. 10 is a cross-sectional view of the alternative embodiment of the heat pipe in accordance with the present invention.

Referring now to FIG. 10, an alternative embodiment 100 of the assembly of the present invention is shown. In this alternative embodiment, a housing 116 is provided of a thermally conductive material as in the outer housing 16 described in connection with the preferred embodiment 10 above. However, in this alternative embodiment 100, an internal wick structure is completely omitted which saves cost and time of manufacture. The operation of the alternative embodiment 100 of FIG. 10 is similar to the preferred embodiment 10 in that each of the cooling members 114 serve as condensers while the base 112 serves as an evaporator. Heat transporting media 144 changes phase to vapor when heated up by contact with heat generating member 142. The arrows indicate rising of the heat transporting media 44, in vapor form, into chambers 122. Upon cooling within the cooling members 114, the vapor condensates and falls, by gravity, back into base chamber 118. Without the wick structure shown in the preferred embodiment 10 above, this alternative embodiment 100 will be sensitive to gravity and, therefore, suitable only for certain applications. The unique cooling member vapor condenser channels 122 and base evaporator chamber 118 are provided to carry out the present invention.

The present invention has a wide range of applications and can be easily adapted for such applications. For example, the present invention may be employed for any heat generating object even if the outer surface thereof is non-uniform. In such an application, the outer housing and wick structure are formed accordingly. The present invention is unique in that is provides for superior heat dissipation in a passive design with no moving parts. The combination of a heat pipe with a heat sink geometry as herein disclosed greatly enhances the overall thermal conductivity of the assembly over prior art designs. For example, a pure aluminum metal heat sink block with grid array has an effective thermal conductivity of 200 W/m°K while a similar configuration with a interconnected chambers 18, 22 and 118, 122 within the cooling members 14, 114 and base 12, 112 provide for dissipation with an effective performance on the order of 20,000 W/m°K. As a result, the phase change heat sink and a heat sink geometry provides results far superior to those found in prior art devices.

It would be appreciated by those skilled in the art that various changes and modifications can be made to the illustrated embodiments without departing from the spirit of the present invention. All such modifications and changes are intended to be covered by the appended claims.

What is claimed is:

1. A method of forming a phase change heat sink assembly, comprising the steps of:
    forming a wick frame having a hollow base, with an base chamber, and a plurality of hollow upstanding members, with respective upstanding member chambers; said base chamber being in fluid communication with said upstanding member chambers;
    placing said wick frame into a mold;
    overmolding an outer housing of moldable thermally conductive polymer material around said hollow base and said hollow upstanding members of said wick frame; said outer housing formed around said hollow base being an evaporation region and said outer housing formed around said upstanding members being respective condensation chambers;
    forming a load hole through said outer housing and said hollow base;
    introducing heat transporting media through said load hole into said hollow base; and
    sealing said load hole thereby trapping said heat transporting media within said outer housing.

2. The method of claim 1, further comprising the step of:
    introducing a vacuum in said outer housing via said load hole.

3. The method of claim 1, wherein said plurality of upstanding members are posts.

4. The method of claim 1, wherein said plurality of upstanding members are in a pin grid array.

5. The method of claim 1, wherein said heat transporting media is water.

6. The method of claim 1, wherein said heat transporting media is ammonia.

7. The method of claim 1, further comprising the step of forming said wick structure by hot-pressing a layer of metal.

8. The method of claim 1, further comprising the step of forming said wick structure by sintering a layer of metal.

9. The method of claim 7, wherein said layer of metal is oxygen-free copper.

10. The method of claim 8, wherein said layer of metal is oxygen-free copper.

* * * * *